United States Patent [19]

Takao et al.

[11] Patent Number: 5,036,301
[45] Date of Patent: Jul. 30, 1991

[54] FILTER APPARATUS

[75] Inventors: Nobutaka Takao; Satoshi Yokoya, both of Kanagawa; Kotaro Takagi, Tokyo, all of Japan

[73] Assignee: Sony Corporation, Tokyo, Japan

[21] Appl. No.: 500,481

[22] Filed: Mar. 28, 1990

[30] Foreign Application Priority Data

Mar. 30, 1989 [JP] Japan .................................. 1-79941
Mar. 30, 1989 [JP] Japan .................................. 1-79942

[51] Int. Cl.$^5$ .......................... H03H 7/00; H05K 1/11
[52] U.S. Cl. .................................. 333/185; 333/246; 361/400; 361/414; 361/424
[58] Field of Search ............... 333/184, 185, 175, 204, 333/246; 361/412, 414, 424, 394, 395, 397, 399, 401, 404

[56] References Cited

U.S. PATENT DOCUMENTS

| | | | |
|---|---|---|---|
| 3,876,822 | 4/1975 | Davy et al. | 361/424 |
| 3,991,347 | 11/1976 | Hollyday | 361/400 |
| 4,242,720 | 12/1980 | Moore | 361/424 X |
| 4,904,968 | 2/1990 | Theus | 333/246 |
| 4,945,323 | 7/1990 | Gerstenberg et al. | 333/185 |

Primary Examiner—Eugene R. LaRoche
Assistant Examiner—Seung Ham
Attorney, Agent, or Firm—Lewis H. Eslinger

[57] ABSTRACT

A filter apparatus comprised of a multi-layer printed circuit board has a shielded filter with input and output terminals protruding from the circuit board, when the filter is mounted on the printed circuit board. Two insulating substrates form the printed circuit board, and a connective conductive pattern is formed on an inner surface of one of the substrates that faces the other substrate. Conductive layers are formed on respective outer surfaces of the substrate opposing the connection conductive pattern, wherein at least one of the input and output terminals of the filter is connected to the connective conductive pattern and the conductive layers are grounded, thereby shielding the connective conductive pattern.

10 Claims, 7 Drawing Sheets

FILTER APPARATUS

BACKGROUND OF THE INVENTION

1. Field of the Invention

This invention relates generally to a filter apparatus and, more particularly, to bandpass filters mounted on a printed circuit board for use in a communication system, such as a mobile telephone system.

2. Description of the Prior Art

In a duplex-type communication system, such as a mobile telephone system, a directional coupler or antenna coupling device is generally utilized to transmit and/or receive radio waves via a single antenna.

Figure 1:
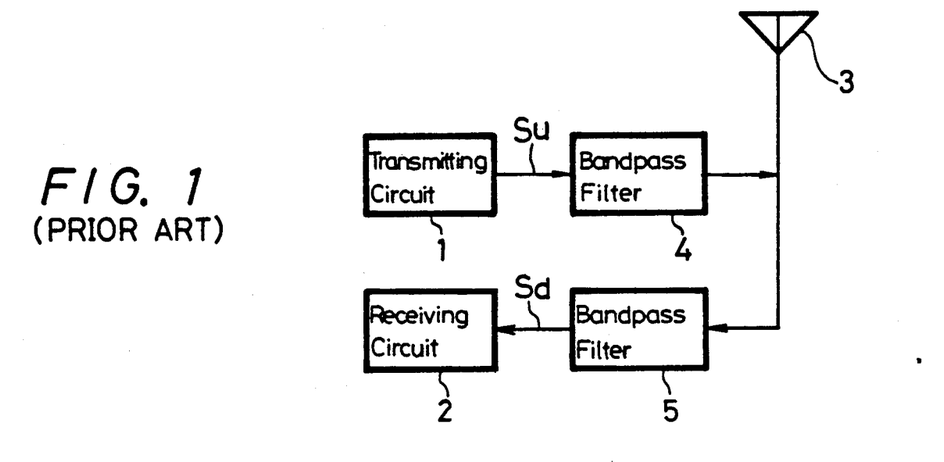
FIG. 1 is a block diagram showing an example of a prior-art communication apparatus of duplex type.

As shown in FIG. 1, when a transmission signal Su of an up-channel is generated by a transmitting circuit 1, the signal Su is supplied to an antenna 3 through a transmission bandpass filter 4 whose pass band covers signals of all up-channels. Then, the signal supplied to the antenna 3 is suitably transmitted to a base station (not shown). A down-channel signal Sd is generated by the base station and is received by antenna 3. The received signal Sd is supplied to a receiving circuit 2 through a reception bandpass filter 5 whose pass band covers signals of all down-channels.

In the mobile telephone system, the frequencies of the transmitted and received signals Su and Sd are in the high frequency range, for example 800 to 900 MHz, so as might be expected leakage of the signals frequently occurs.

Figure 2:
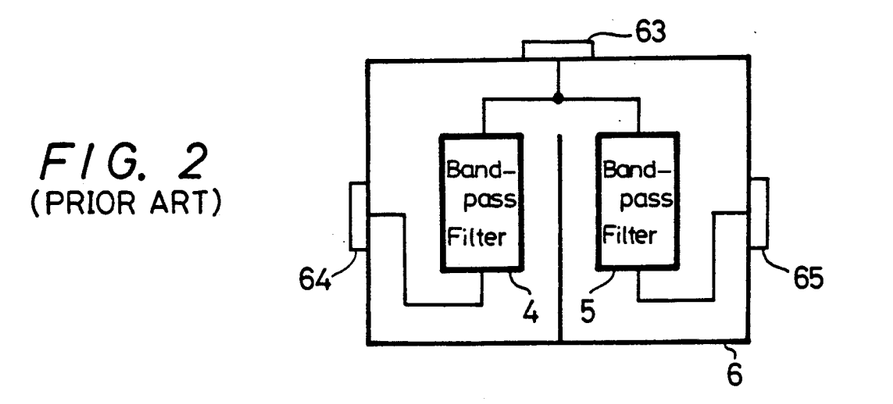
FIG. 2 is a schematic diagram showing an example of filters accommodated within a single shield casing.

To solve the above-described signal leakage problem, as shown in FIG. 2, the bandpass filters 4 and 5 are accommodated in a common shield casing 6. The output terminal of bandpass filter 4 and the input terminal of bandpass filter 5 are connected to coaxial connector 63 and the input terminal of bandpass filter 4 is connected to coaxial connector 64 and the output terminal of bandpass filter 5 is connected to coaxial connector 65. Input and output coaxial connectors 63, 64 and 65 are provided on different side surfaces of the shield casing 6. It is desired that an isolation characteristic exist between the terminals connected to coaxial connectors 63, 64, and 65, so that a response outside of the pass band is less than −60 dB.

Thus, a directional coupler is formed of bandpass filters 4 and 5 that are accommodated within a unitary shield casing 6. Nevertheless, this directional coupler has an unavoidable defect in that the directional coupler formed as a single body requires three separate coaxial connectors 63, 64, and 65. Thus, the antenna apparatus is made expensive. Further, it is difficult to mount the antenna apparatus on a printed circuit board because the three coaxial connectors 63, 64, and 65 are located on different side surfaces of shield casing 6 as shown in FIG. 2.

OBJECTS AND SUMMARY OF THE INVENTION

Accordingly, it is an object of the present invention to provide an improved filter apparatus that is mounted on a multi-layer printed circuit board that can eliminate the above-noted defects in the prior art.

Another object of the present invention to provide a filter apparatus with an improved shielding effect.

Still another object of the present invention is to provide a filter apparatus in which filters and signal paths can be freely designated without signal leakage.

A further object of the present invention is to provide a filter apparatus in which filters and signal paths can be positioned with greater freedom.

Still a further object of the present invention is to provide a filter apparatus that avoids transmission and reflection losses.

According to a first aspect of the present invention, a filter apparatus is comprised of a multi-layer printed circuit board and a filter having input and output terminals that when mounted extend through the multi-layers and protrude from the printed circuit board. The printed circuit board has insulating substrates forming the multi-layers and a connection conductive pattern is formed on an upper inner surface of one substrate that is in contact with the other substrate. Conductive layers are formed on the substrates at respective outer surfaces of the substrates so that the conductive layers are arranged with one conductive layer positioned above the connection conductive pattern and another positioned below the connection conductive pattern. In this way at least one of the input and output terminals of the filter is connected to the connective conductive pattern and the conductive layers are grounded, thereby shielding the inside conductive pattern.

In a second aspect of the present invention, a filter apparatus is comprised of a multi-layer printed circuit board and a filter having input and output terminals that when mounted extend through the multi-layers and protrude from the printed circuit board. The printed circuit board has insulating substrates forming the multi-layers and a connection conductive pattern is formed on an upper inner surface of one substrate that is in contact with the other substrate. Conductive layers are formed on the substrates at respective outer surfaces, so that the conductive layers are arranged with one conductive layer positioned above the connection conductive pattern and another positioned below the connection conductive pattern. A plurality of through-hole conductive layers are formed through the conductive layers so as to connect the outer conductive layers and to encircle the connective conductive pattern, wherein the conductive layers connected by the through-hole layers are grounded and the connective conductive pattern is shielded by the conductive layers and the through-hole layers.

The above and other objects, features, and advantages of the present invention will be apparent in the following detailed description of the preferred embodiments of the invention with reference to the accompanying drawings, in which like reference numerals are used to identify the same or similar parts in the several views.

DETAILED DESCRIPTION OF THE PREFERRED EMBODIMENTS

The present invention will now be described in detail with reference to the drawings.

Figure 3:
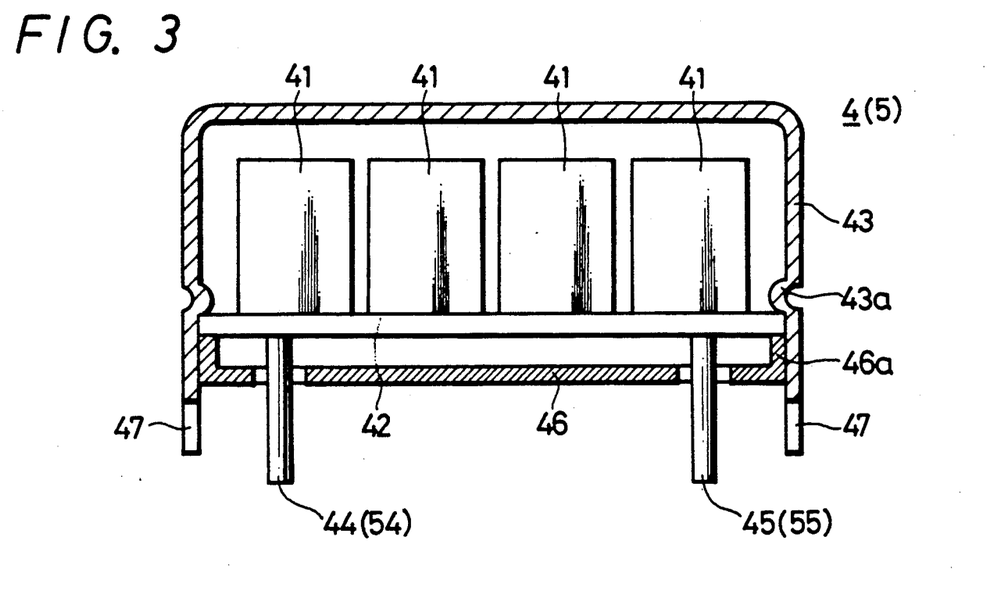
FIG. 3 is an elevational view in cross section of a filter according to an embodiment of the present invention.
Figure 4:
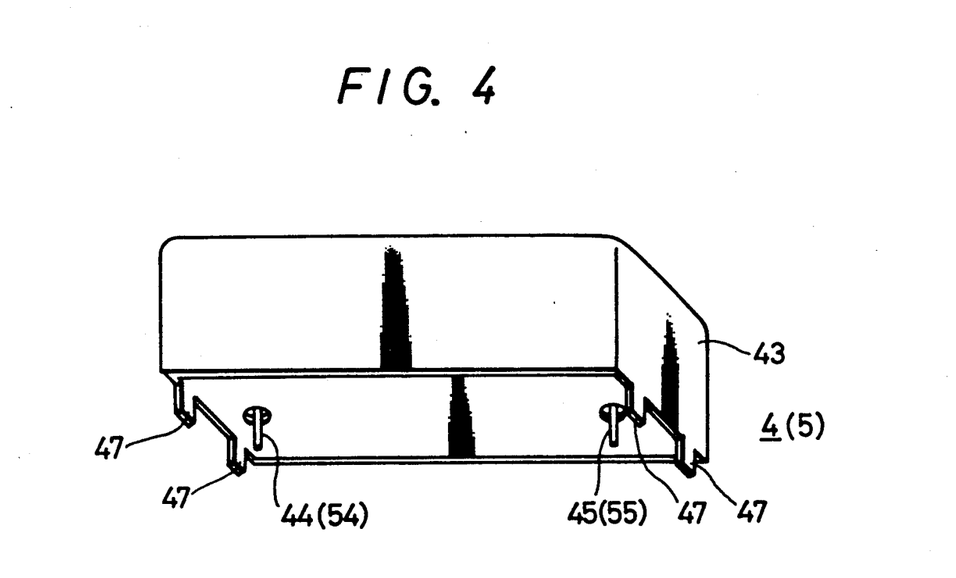
FIG. 4 is a perspective view of the filter of FIG. 3.

Referring to the drawings in detail, and initially to FIGS. 3 to 6 and FIGS. 8 to 10, a first embodiment of a filter apparatus according to this invention will be described. As shown in FIGS. 3 and 4, the transmission filter 4 includes a plurality of resonant circuits 41 mounted on a printed circuit board 42. The plurality of resonant circuits 41 mounted on printed circuit board 42 are accommodated within a rectangular shield casing 43. An input terminal 44 and an output terminal 45 are connected to a predetermined pattern on the printed circuit board 42 and both terminals protrude from a shield bottom plate 46 of shield casing 43 in the same direction. Shield casing 43 includes leg portion 47 for soldering to the final assembly and completing the shielding. In this case, printed circuit board 42 is held between a convex portion 43a protruding from an inner surface of shield casing 43 and upraised side member 46a of bottom plate 46. Bottom plate 46 is attached to shield casing 43 by soldering.

In a like manner, reception filter 5 is formed as a unitary block and is shielded.

Figure 5:
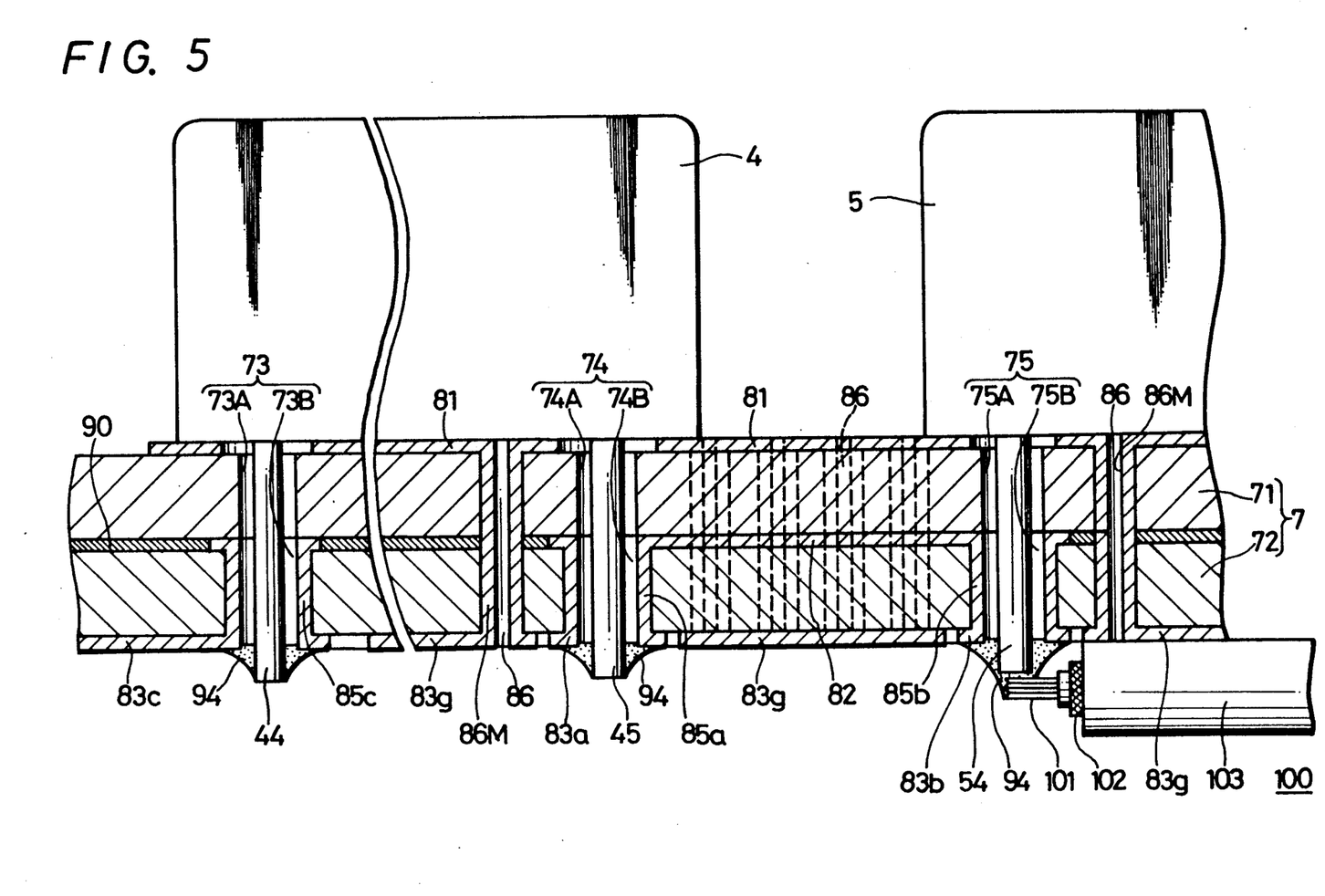
FIG. 5 is an elevational view in cross section of a filter apparatus according to an embodiment of the present invention.

As shown in FIG. 5, filters 4 and 5 are mounted on printed circuit board 7 in series such that output terminal 45 of filter 4 and input terminal 54 of filter 5 protrude from the same surface of printed circuit board 7.

Further, in the embodiment of FIG. 5 printed circuit board 7 is formed as a multi-layer assembly. More specifically, upper and lower substrates 71 and 72 are insulating substrates made of, for example, a glass epoxy resin and these substrates 71 and 72 are subsequently laminated to form the multi-layer printed circuit board 7.

As shown in FIG. 5, through-holes 73, 74, and 75 are formed through these substrates 71 and 72 so as to receive therein the input and output terminals 44, 45, 54 and 55 (not shown). The output terminal 55 of filter 5 and a through-hole into which the output terminal 55 is inserted is not shown in FIGS. 3 to 8 but it is similar to the illustration of filter 4 and through-hole 73 shown in FIG. 5. Through-hole 73A, 74A and 75A formed through the upper substrate 71 and through-holes 73B, 74B and 75B formed through the lower substrate 72 are combined to form through-holes 73, 74, and 75.

Figure 6:
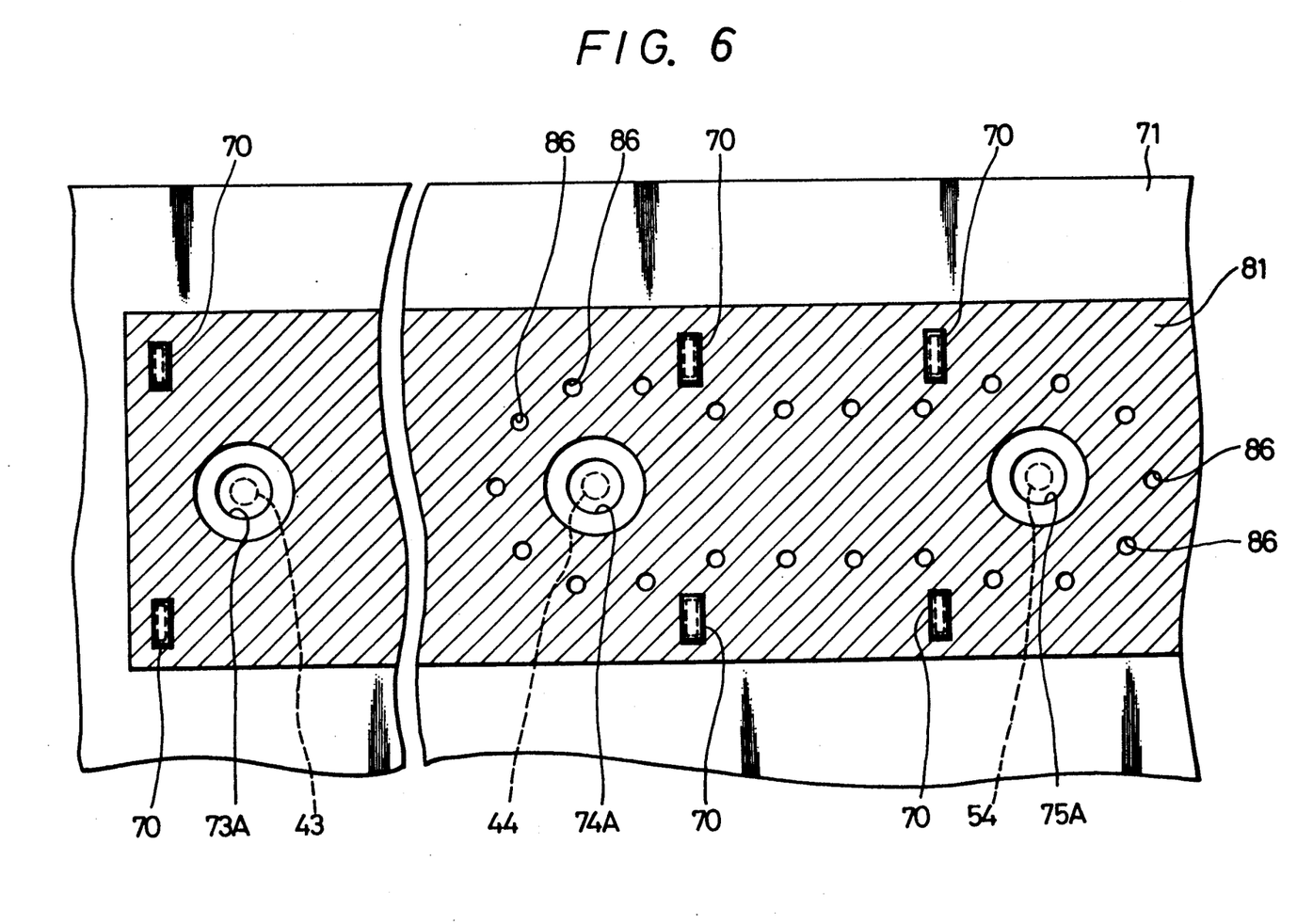
FIG. 6 is a plan view showing a pattern of an upper substrate of a printed circuit board used in the embodiment of FIG. 5.
Figure 7:
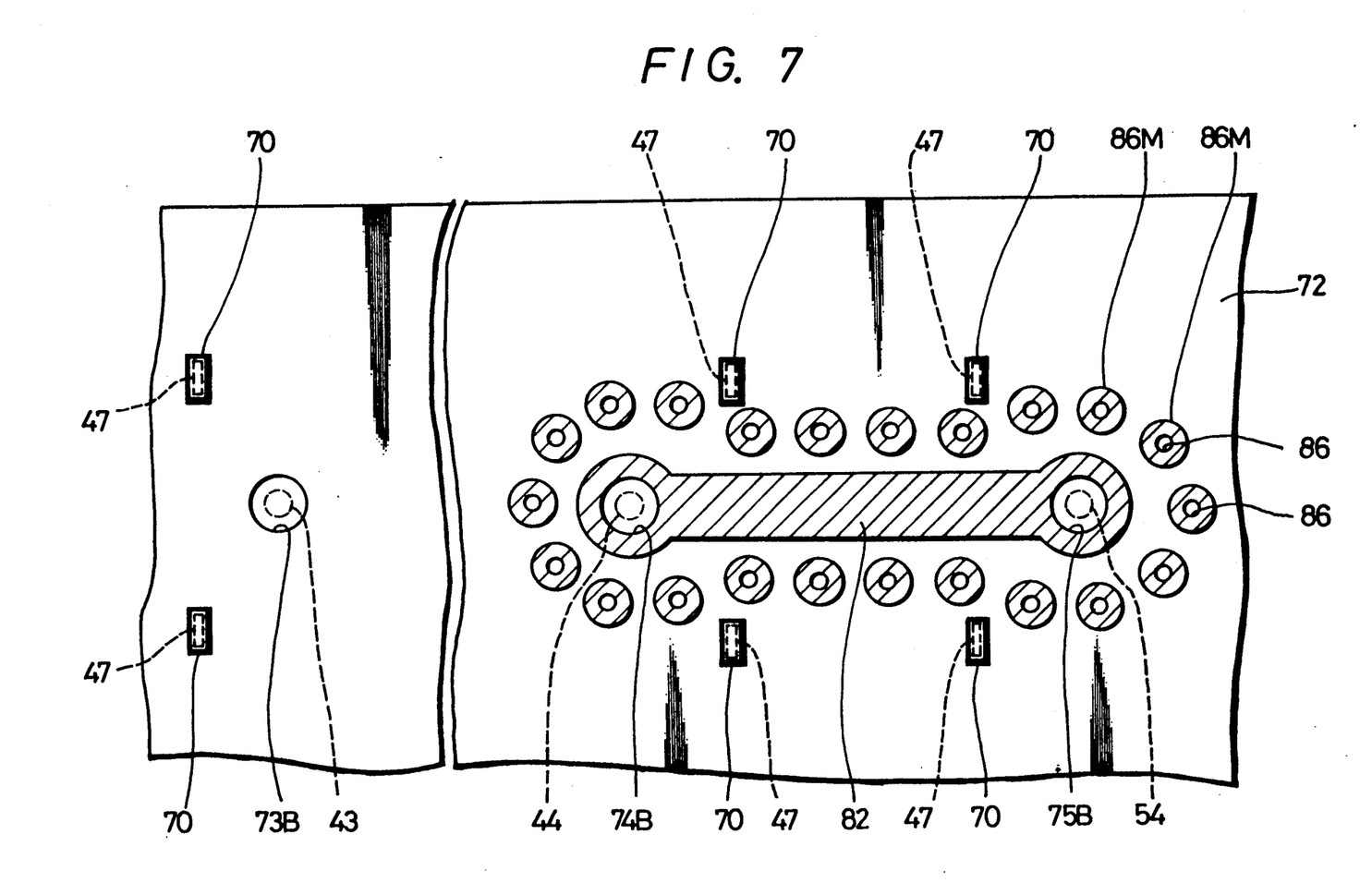
FIG. 7 is a plan view showing an upper surface pattern of a lower substrate of a printed circuit board used in the embodiment of FIG. 5.

Upper substrate 71 has a conductive pattern formed on the top surface thereof, whereas lower substrate 72 is formed as a so-called double-sided printed circuit board in which conductive patterns are formed on the top and bottom surfaces thereof. More specifically, ground conductive pattern 81 is formed on a so-called mount surface of the upper substrate 71, as shown in FIG. 6, and a connection conductive pattern 82 is formed on the top surface of lower substrate 72, as shown in FIG. 7. Further, soldering round patterns 83a, 83b, and 83c and a ground conductive pattern 83g are formed on the lower surface of lower substrate 72, as shown in FIG. 8.

In this case, ground conductive pattern 81 is formed on the mount surface of upper substrate 71 at a position opposing the filters 4 and 5 when mounted. The mount surface is formed large enough to accommodate through-holes 73A, 74A, and 75A, so that portions surrounding through-holes 73A, 74A, and 75A are also grounded.

Connection conductive pattern 82 is formed on the top surface of the lower substrate 72 so as to connect the surrounding portions of the through-holes 74B and 75B, as shown in FIG. 7.

Figure 8:
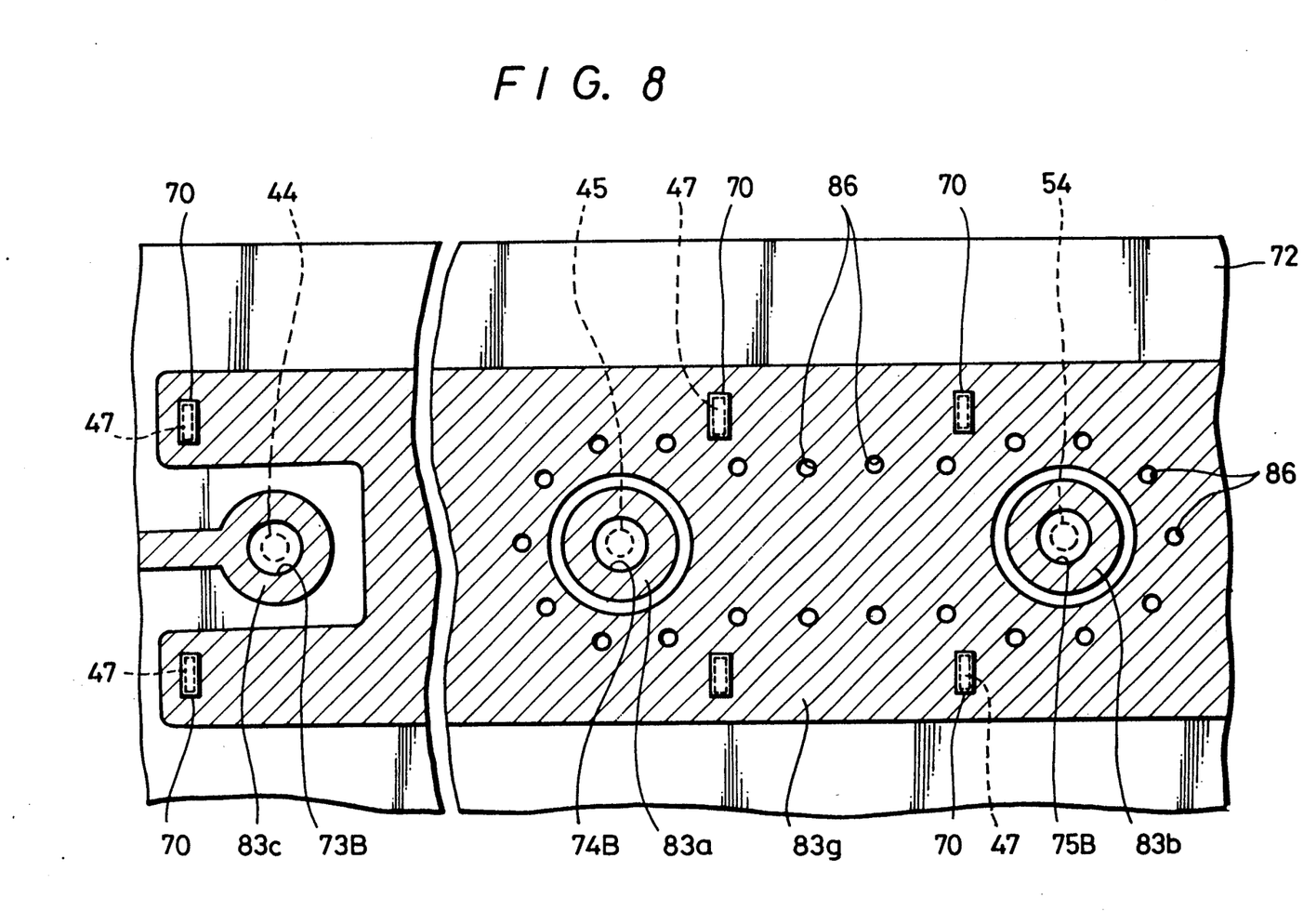
FIG. 8 is a bottom plan view showing a lower surface pattern of the lower substrate of a printed circuit board used in the embodiment of FIG. 5.

Furthermore, as shown in FIG. 8, the conductive pattern on the bottom surface of lower substrate 72 is divided to provide soldering round conductive pattern portions 83a and 83b around through-holes 74B and 75B, soldering round conductive pattern portion 83c around through-hole 73B, and ground conductive pattern 83g covering much of the remaining lower surface of lower substrate 72 but not connected to solder round conductive pattern portions 83a, 83b, and 83c. Soldering round conductive pattern portions 83a and 83b are electrically connected together via through-hole plating layers 85a and 85b formed on the internal walls of through-holes 74B and 75B, as shown in FIG. 5. Soldering round conductive pattern 83c is also electrically connected to a through-hole plating layer 85c formed on the inner wall of through-hole 73B. Ground conductive layer 83g is formed on the lower surface of the lower substrate 72 at a position opposing at least the connection conductive pattern 82 on the upper surface of lower substrate 72 and is subsequently grounded.

As shown in FIG. 6, insertion apertures 70 for filter tabs 47 and apertures 86 are formed by suitable means such as the punching, drilling using a ball mill when upper and lower substrates 71 and 72 are bonded together by an adhesive agent 90, as shown in FIG. 5. Insertion apertures 70 receive therein leg portions 47 of shield casing 43 of filters 4 and 5. The plurality of apertures 86 surround connection conductive pattern 82 and after drilling is finished portions other than through-holes 86 are masked and then through-holes 86 are plated, thereby to form plated layers 86M on the interior surfaces of all of these through-holes 86. Further, as shown in FIG. 7, the plurality of through-holes 86 are arranged so as to surround completely connective conductive pattern 82 with a predetermined spacing therebetween and with a predetermined distance relative to the connective conductive pattern 82. Through-holes 86 and plated layers 86M are formed to electrically connect the ground conductive patterns 81 and 83g.

In addition, filters 4 and 5 are mounted on the mount surface of substrate 7, so that input and output terminals 44 and 45 of filter 4 and input terminal 54 of filter 5 are inserted into the through-holes 73, 74, and 75, respectively. Further, terminals 44, 45, and 54 are soldered to soldering round patterns 83c, 83a, and 83b by solder 94. Simultaneously, leg portions 47 of shield casing 43 of both filters 4 and 5 are soldered to a ground conductive pattern 83g by solder 94. The output terminal that is not shown of filter 5 is also soldered to a soldering round patten provided at a position symmetrical to that of the conductive pattern 83c.

As shown in FIG. 5, a central conductor 101 of a coaxial cable 100 which is connected to antenna 3, and is soldered to terminal 54 and soldering round pattern 83b with solder 94. A shield wire 102 of coaxial cable 100 is formed as a woven mesh and cable 100 has an outer insulating cover 103.

According to the above-described embodiment, the transmission signal Su from filter 4 is supplied to antenna 3 through a signal path composed of the internal circuitry of filter 4, terminal 45, solder 94, soldering round pattern 83a, through-hole layer 85a, connection conductive pattern 82a, through-hole layer 85b, soldering round pattern 83b, solder 94, coaxial cable 100 and antenna 3 in that order, and is then transmitted from antenna 3.

The received signal Sd from antenna 3 is supplied to filter 5 through a signal path composed of antenna 3, coaxial cable 100, solder 94, terminal 54 and filter 5, in that order.

The transmission of the signal Su and the reception of the signal Sd are carried out as described above. In particular, according to the present invention, the connection conductive pattern 82, which becomes the signal path of the signal Su, is sandwiched between the ground conductive patterns 81 and 83g and is shielded from leakage in the planes of the substrate by the plurality of through-hole layers 86M, so as to act as a shielded strip path or coaxial cable, thereby preventing the signal Su from being leaked.

Figure 9:
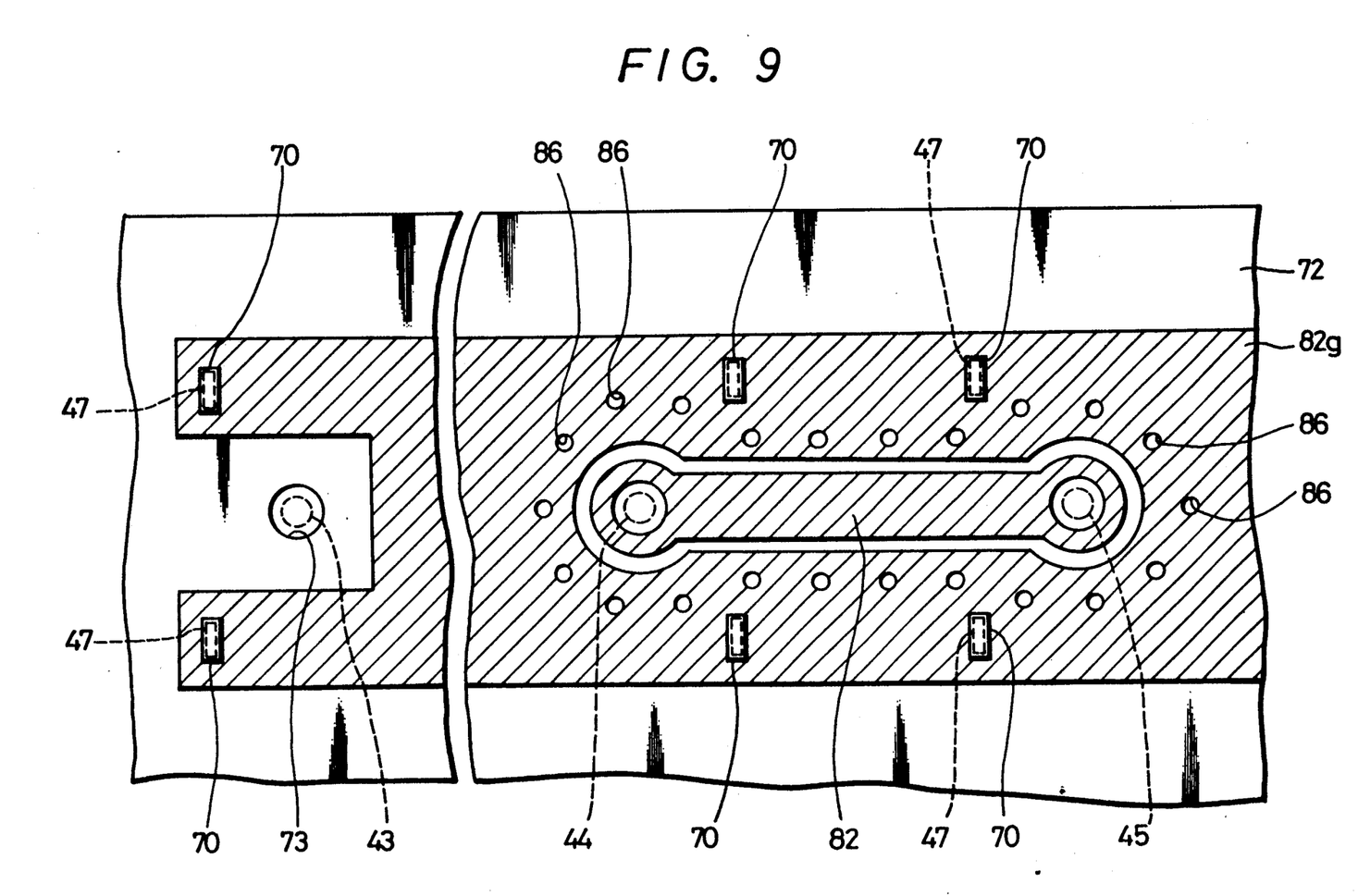
FIG. 9 is a plan view showing a upper surface pattern of a lower substrate of a printed circuit board according to a second embodiment of the present invention.

A second embodiment of the filter apparatus according to the present invention will be described next. In this embodiment, the shielding effect is made more powerful. In order to increase the shielding effect, a ground conductive pattern 82g encircling connection conductive pattern 82 with a predetermined spacing is provided on the top surface of lower substrate 72, as shown in FIG. 9. A plurality of through-hole plated layers shown at 86M in FIG. 5, are formed in the ground conductive pattern 82g, whereby ground conductive pattern 82g is connected to ground conductive patterns 81 and 83g. Nevertheless, in the first and second embodiments of the invention, the shielding effect of connection conductive pattern 82 is still satisfactory for most applications, without providing through-holes 86 and through-hole plated layers 86M.

Further, according to the present invention, filters 4 and 5 and the signal paths for connecting the filters 4 and 5 and the antenna 3 are independently shielded, whereby the isolation between the respective input and output terminals can be improved. Also, since filters 4 and 5 and the signal paths are independently shielded, these filters 4 and 5 and the signal path can be freely designed that is, laid out in any desired fashion when designing the printed circuit board. Thus, filters 4 and 5 can be mounted on printed circuit board 7 together with assembly parts of transmitting circuit 1 and receiving circuit 2.

Filters 4 and 5 are not always located in series that is, aligned on the same direction as described above. Filters 4 and 5 may be aligned in a direction so that the filters are at right angles (90 degrees) to each other in response to the size or shape of the printed circuit board 7. In that case, the ground conductive patterns 81 and 83g and connection conductive pattern 82 are curved by 90 degrees, whereby filters 4 and 5 and the signal paths are positioned with greater freedom.

By selecting a proper spacing between the through-hole plated layer 86M and conductive pattern 82 or selecting a proper width of conductive pattern 82, it is possible to perform an impedance matching between filters 4, 5 and coaxial cable 100. Thus, the signals Su and Sd can be transmitted properly and transmission and reflection losses can be avoided.

Figure 10:
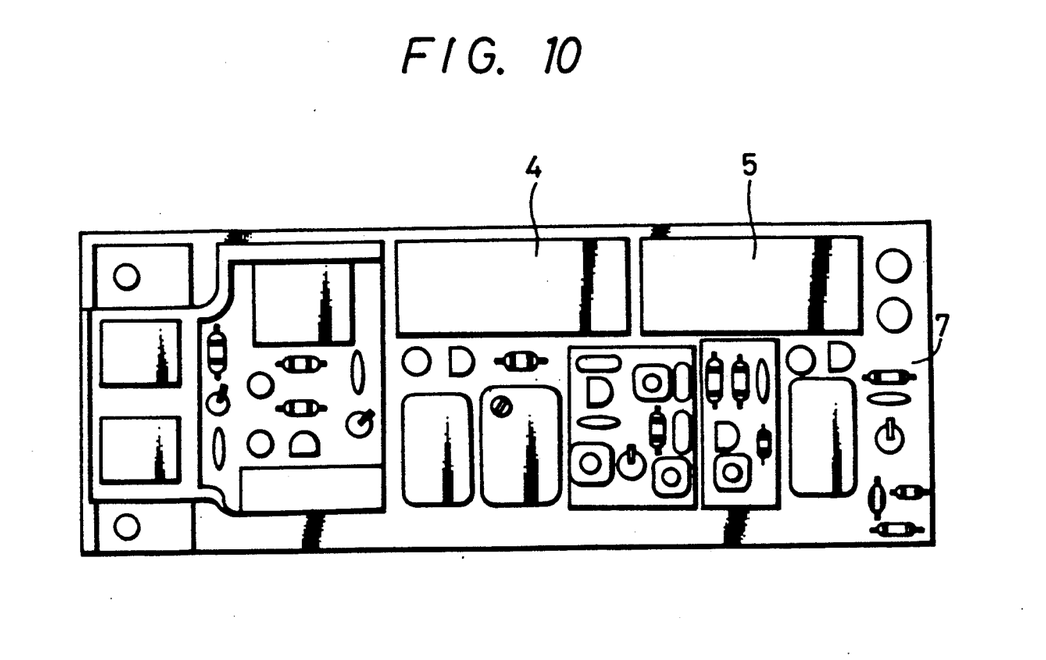
FIG. 10 is a plan view showing an overall arrangement of the filter apparatus according to an embodiment of the present invention.

Further, as shown in FIG. 10, filters 4 and 5 can be directly mounted on printed circuit board 7 and the expensive coaxial connectors 63, 64 and 65 are not needed, thereby reducing the cost of the filter apparatus considerably.

According to the present invention, as set forth above, since connection conductive pattern 82, which becomes a signal path of the signal Su, is shielded by conductive patterns 81 and 83g formed on the mount surface and the soldered surface, respectively, and the through-hole plated layers 86M act as the shielded strip path, it is possible to prevent leakage of the signal Su.

Further, since filters 4 and 5 and the signal paths layers 86M act as the shielded strip path, it is possible to prevent leakage of the signal Su.

Further, since filters 4 and 5 and the signal paths for connecting the filters 4, 5 and antenna 3 are independently shielded, isolation between the input and output terminals is improved. Also, since filters 4 and 5 and the signal paths are independently shielded, these filters 4 and 5 and the signal paths can be designed with greater freedom. In addition, filters 4 and 5 can be mounted on printed circuit board 7 together with the assembly parts of the transmitting circuit and the receiving circuit 2, and they can be positioned on the circuit board with greater freedom.

The above description is given on preferred embodiments of the invention, but it will be apparent that many modifications and variations could be effected by one skilled in the art without departing from the spirit or scope of the novel concepts of the invention, which should be determined by the appended claims.

What is claimed is:

1. A filter apparatus comprising:
   a multi-layer printed circuit board formed of first and second insulating substrates;
   a filter mounted on said printed circuit board, said filter having input and output terminals which extend through and protrude from said printed circuit board;
   a connection conductive pattern formed on said second insulating substrate on an inner surface thereof facing said first insulating substrate; and
   a plurality of conductive layers formed on outer surfaces of said first and second insulating substrates, said plurality of conductive layers being arranged with a first of said conductive layers positioned above said connection conductive pattern and a second of said conductive layers positioned below said connection conductive pattern, wherein at least one of said input and output terminals of said filter is connected to said connection conductive pattern and said plurality of conductive layers are grounded, thereby shielding said connection conductive pattern.

2. A filter apparatus according to claim 1, further comprising an encircling conductive pattern formed so as to encircle said connection conductive pattern, said encircling conductive pattern formed of a plurality of through-holes in said multi-layer printed circuit board, said through-holes each having a plated conductive layer.

3. A filter apparatus according to claim 2, further comprising a ground conductive layer formed so as to encircle said connection conductive pattern wherein said through-holes protrude through said ground conductive layer and said ground conductive layer is grounded.

4. A filter apparatus according to claim 1, further comprising a shielding case for accommodating therein said filter mounted to said printed circuit board.

5. A filter apparatus according to claim 1, wherein said input and output terminals protrude in the same direction from said multi-layer printed circuit board.

6. A filter apparatus comprising:
a multi-layer printed circuit board formed of first and second insulating substrates;
a filter mounted on said printed circuit board, said filter having input and output terminals which extend through and protrude from said printed circuit board;
a connection conductive pattern formed on said second insulating substrate on an inner surface thereof facing said first insulating substrate;
a plurality of conductive layers formed on outer surfaces of said first and second insulating substrates, said plurality of conductive layers being arranged with a first of said conductive layers positioned above said connection conductive pattern and a second of said conductive layers positioned below said connection conductive pattern; and
a plurality of plated conductive through-holes formed through first and second substrates and said plurality of conductive layers encircling and arranged for said input and output terminals so as to connect said conductive layers and so as to encircle said connective conductive pattern, wherein said conductive layers connected by said through-holes are grounded and said connective conductive pattern is shielded by said conductive layers and said through-holes.

7. A filter apparatus according to claim 6, wherein said plurality of through-holes are surrounded by a plating layer so that said input and output terminals encircled by said through-holes are shielded.

8. A filter apparatus according to claim 6, further comprising a shielding case for accommodating therein said filter.

9. A filter apparatus according to claim 6, wherein said input and output terminals protrude in the same direction from said printed circuit board.

10. A filter apparatus according to claim 7, further comprising a ground conductive layer formed so as to encircle said connection conductive pattern wherein said through-holes protrude through said ground conductive layer and said ground conductive layer is grounded.

* * * * *